(12) United States Patent
Sasaki et al.

(10) Patent No.: US 9,110,119 B2
(45) Date of Patent: Aug. 18, 2015

(54) ELECTRIC CURRENT MEASUREMENT METHOD

(71) Applicants: Satoru Sasaki, Toyota (JP); Hideki Tojima, Toyota (JP); Johann Kolar, Zurich (CH); Benjamin Wrzecionko, Zurich (CH); Lukas Steinmann, Zurich (CH); Johann Ertl, Zurich (CH)

(72) Inventors: Satoru Sasaki, Toyota (JP); Hideki Tojima, Toyota (JP); Johann Kolar, Zurich (CH); Benjamin Wrzecionko, Zurich (CH); Lukas Steinmann, Zurich (CH); Johann Ertl, Zurich (CH)

(73) Assignees: Toyota Jidosha Kabushiki Kaisha, Toyota-shi, Aichi-ken (JP); Swiss Federal Institute of Technology Zurich, Zurich (CH)

( * ) Notice: Subject to any disclaimer, the term of this patent is extended or adjusted under 35 U.S.C. 154(b) by 318 days.

(21) Appl. No.: 13/851,733

(22) Filed: Mar. 27, 2013

(65) Prior Publication Data
US 2013/0278252 A1  Oct. 24, 2013

(30) Foreign Application Priority Data

Mar. 30, 2012  (JP) ................................ 2012-082382

(51) Int. Cl.
G01R 33/02 (2006.01)
G01R 15/18 (2006.01)

(52) U.S. Cl.
CPC .............. G01R 33/02 (2013.01); G01R 15/183 (2013.01)

(58) Field of Classification Search
CPC ... G01R 15/185; G01R 19/009; G01R 33/022
See application file for complete search history.

(56) References Cited

U.S. PATENT DOCUMENTS 8,487,612 B2 * 7/2013 Ichinohe et al. ............... 324/252
2006/0076945 A1 * 4/2006 Takahashi et al. .......... 324/76.11
2012/0153937 A1 * 6/2012 Pozzati et al. ................ 324/202

FOREIGN PATENT DOCUMENTS

DE    102009028167   *  7/2009
JP    2002-207053       7/2002

OTHER PUBLICATIONS

Davide Azzoni et al., "An Innovative Low-Cost, High Performance Current Transducer for Battery Monitoring Applications: Prototype Preliminary Results", Proceedings PCIM Europe 2009 Conference, pp. 443-449.

* cited by examiner

Primary Examiner — Arleen M Vazquez
Assistant Examiner — Feba Pothen
(74) Attorney, Agent, or Firm — Finnegan, Henderson, Farabow, Garrett & Dunner, LLP

(57) ABSTRACT

An electric current measurement method is provided with: a first controlling process of sweeping a sensing current in a negative magnetization direction in a condition that a core is saturated magnetically in a positive magnetization direction; a second controlling process of sweeping the sensing current in the positive magnetization direction in a condition that the core is saturated magnetically in the negative magnetization direction; a first specifying process of specifying a value of the sensing current if the core is demagnetized in the first controlling process; a second specifying process of specifying a value of the sensing current if the core is demagnetized in the second controlling process; and a calculating process of calculating a value of a target electric current on the basis of the specified current values, the first and second controlling processes being performed repeatedly.

5 Claims, 8 Drawing Sheets

ELECTRIC CURRENT MEASUREMENT METHOD

BACKGROUND OF THE INVENTION

1. Field of the Invention

The present invention relates to an electric current measurement method in a magnetic current sensor.

2. Description of the Related Art

The electric current measurement method in a magnetic current sensor is disclosed, for example, in Non-patent document 1, The Non-patent document 1 discloses a technology in which a core-unsaturated area is used to calculate a current value from a current difference between core unsaturation and core saturation (referred to as a first conventional technology), and a technology in which a core-saturated area is used and a sensing current is applied in a demagnetization direction to calculate a current value from a current value when the core is saturated in an opposite direction (referred to as a second conventional technology).

Incidentally, a circuit configuration using the magnetic current sensor is also disclosed in Patent document 1.

PRIOR ART DOCUMENT

Non-Patent Document

Non-patent document 1: An Innovative Low-Cost, High Performance Current Transducer for Battery Monitoring Applications: Prototype Preliminary Results, PCIM Europe 2009 Conference

Patent Document

Patent document 1: Japanese Patent Application Laid Open No. 2002-207053

In the first conventional technology, the core-unsaturated area is used, and a magnetic flux characteristic for a magnetic field (hereinafter referred to as a "B-H characteristic of the core", as occasion demands) changes depending on a core temperature. In the first conventional technology, the calculated current value changes depending on the core temperature because the first conventional technology does not have any means of correcting the B-H characteristic in accordance with core temperature. In other words, current measurement accuracy is insufficient.

On the other hand, in the second conventional technology, the core-saturated area is used, and thus, the measurement accuracy due to the core temperature hardly varies. However, since the sensing current is only applied from one saturated area to another saturated area, a hysteresis of the B-H characteristic causes an error in the calculated current value. In other words, the current measurement accuracy is insufficient.

As described above, the previous current measurement method in the magnetic current sensor including the first and second conventional technologies has such a technical problem that the current measurement accuracy is insufficient.

SUMMARY OF THE INVENTION

It is therefore an object of the present invention to provide a high-precision current measurement method which is not influenced by the core temperature and the hysteresis of the core in the magnetic current sensor.

The above object of the present invention can be achieved by an electric current measurement method for measuring a target electric current on a magnetic current sensor, the magnetic current sensor comprising: a core in which a magnetic flux density changes depending on the target electric current: an electrically conductive device capable of changing the magnetic flux density of the core depending on a sensing current: and an adjusting device capable of controlling a direction of the sensing current, said electric current measurement method comprising: a first controlling process of sweeping the sensing current toward in a negative magnetization direction in a condition that the core is saturated magnetically in a positive magnetization direction due to the target electric current; a first detecting process of detecting the magnetic saturation of the core in the negative magnetization direction due to the first controlling process; a second controlling process of sweeping the sensing current toward in the positive magnetization direction if the magnetic saturation of the core in the negative magnetization direction is detected due to the first detecting process; a second detecting process of detecting the magnetic saturation of the core in the positive magnetization direction; a first specifying process of specifying, as a first current value, a value of the sensing current if the core is demagnetized in said first controlling process on the basis of a first saturation time which is a time length from a time point at which the magnetic saturation of the core in the positive magnetization direction is detected in the second detecting process, to a time point at which the magnetic saturation of the core in the negative magnetization direction is detected in the first detecting process; a second specifying process of specifying, as a second current value, a value of the sensing current if the core is demagnetized in said second controlling process on the basis of a second saturation time which is a time length from a time point at which the magnetic saturation of the core in the negative magnetization direction is detected in the first detecting process, to a time point at which the magnetic saturation of the core in the positive magnetization direction is detected in the second detecting process; and a calculating process of calculating a value of the target electric current on the basis of the specified first and second current values, said first controlling process and said second controlling process being performed repeatedly (claim 1).

The magnetic current sensor to which the current measurement method of the present invention is applied is provided with: the core in which a magnetic flux density B changes depending on the target electric current; the electrically conductive device capable of changing the magnetic flux density depending on the sensing current, i.e. capable of magnetically exciting and demagnetizing the core (i.e. capable of driving a change in the magnetic flux density in both the positive and negative magnetization directions); and the adjusting device capable of controlling the direction and magnitude of the sensing current.

The core is made of at least a material having magnetism; however, a shape of the core and specific physical properties related to the magnetism do not significantly influence the current measurement method of the present invention, apart from the judgment of whether or not to be appropriate as the core from a realistic viewpoint. As described later, however, at a start time point of the first controlling process, the core needs to be saturated magnetically in the positive magnetization direction due to the target electric current, and the shape of the core and the physical properties related to the magnetism are desirably determined such that the core is saturated magnetically in the positive magnetization direction in a realistically possible range of the target electric current. Incidentally, the "positive magnetization direction" is a term conveniently used to distinguish between the magnetization directions of the core, and means one magnetization direction of the core. The "negative magnetization direction" means a magnetization direction opposite to the "positive magnetization direction". Therefore, even if the "positive magnetization direction" and the "negative magnetization direction" are replaced by each other, the action thereof does not change at all.

The electrically conductive device is a device capable of changing the magnetic flux density and the magnetization direction of the core depending on the sensing current, and is preferably an electrically conductive coil wound predetermined times around the core. If the core is a toroidal core, the electrically conductive device may be wound to pass through an air core portion of the core. Incidentally, the number of turns of the core is desirably designed to be suited to the magnitude of the magnetic flux density to be generated by the sensing current.

The control of the sensing current performed by the adjusting device means at least the control of the direction of the sensing current. The adjusting device can preferably include, for example, various switching circuits for controlling the direction of the sensing current by changing drive states of various transistors, and a power supply device for applying a drive voltage to the electrically conductive device. The control of the sensing current by the adjusting device is performed, for example, by electrical control performed by a superior processor or the like, while the value of the sensing current and a lapse time from a reference time point are associated with each other.

In this type of magnetic current sensor, the core is demagnetized at a certain time point by sweeping the sensing current in the demagnetization direction in a condition that magnetic flux is generated in the core by the target electric current. On the basis of the value of the sensing current required for the demagnetization (as a simple example, the value of the sensing current at a time point at which the core is judged to be demagnetized), the value of the target electric current can be calculated, for example, by adding specific values of the magnetic current sensor (e.g. an internal diameter of the core, the number of turns of the core, etc.) to the value of the sensing current or by performing similar actions. Incidentally, the "demagnetization" in this case means that the magnetic flux is zero in the strict sense; however, the detection of the magnetic flux density of the core in the course of sweeping the sensing current in real time and with accuracy is generally not easy. Therefore, in practice, the demagnetization includes that the magnetic flux density is reduced to a value corresponding to zero, which is determined in accordance with reasonable grounds.

According to the current measurement method of the present invention, the first controlling process is performed in the condition that the core is saturated magnetically in the positive magnetization direction due to the target electric current. Specifically, the sensing current is swept in the negative magnetization direction by the first controlling process in the condition that the core is saturated magnetically in the positive magnetization direction due to the target electric current. Incidentally, the expression that "the sensing current is swept in the negative magnetization direction" means the direction of the sensing current is controlled in a direction of demagnetizing the core which is saturated magnetically in the positive magnetization direction (a direction of magnetically exciting the core in the negative magnetization direction), and means that the core is saturated magnetically in the negative magnetization direction. However, in an unsaturated area of the magnetic flux density, the magnetic flux density in the course of the sweep changes in a direction of canceling a change in the sensing current, and a time transition of the value of the sensing current (sensing current value) may be thus nonlinear.

In the course of sweeping the sensing current by the first controlling process, whether or not the core is saturated magnetically in the negative magnetization direction is judged by whether or not the magnetic saturation in the negative magnetization direction is detected by the first detecting process. Incidentally, the saturation of the magnetic flux density reduces an effect of suppressing the sensing current, and thus, automatically, the behavior of the sensing current significantly differs between the unsaturated area and the saturated area of the magnetic flux density. Therefore, timing in which the core is saturated magnetically in the negative magnetization direction can be detected, relatively easily, by monitoring the time transition of the sensing current. At this time, proper threshold values may be provided for the sensing current value, a rate of change thereof, and the like, and the magnetic saturation may be detected if the sensing current value and the like are greater than or equal to the respective threshold values.

If the core is saturated magnetically in the negative magnetization direction by the first controlling process (ideally, triggered by the detection of the magnetic saturation in the negative magnetization direction), the second controlling process is started. In the second controlling process, the direction of the sensing current is reversed via the control of the adjusting device, and the sensing current is swept in the positive magnetization direction. Incidentally, the expression that "the sensing current is swept in the positive magnetization direction" means the direction of the sensing current is controlled in a direction of demagnetizing the core which is saturated magnetically in the negative magnetization direction (a direction of magnetically exciting the core in the positive magnetization direction), and means that the core is saturated magnetically in the positive magnetization direction. However, in the unsaturated area of the magnetic flux density, the magnetic flux density in the course of the sweep changes in the direction of canceling the change in the sensing current, and the time transition of the value of the sensing current (sensing current value) may be thus nonlinear.

In the course of sweeping the sensing current by the second controlling process, whether or not the core is saturated magnetically in the positive magnetization direction is judged by whether or not the magnetic saturation in the positive magnetization direction is detected by the second detecting process. Incidentally, the saturation of the magnetic flux density reduces the effect of suppressing the sensing current, and thus, automatically, the behavior of the sensing current significantly differs between the unsaturated area and the saturated area of the magnetic flux density. Therefore, timing in which the core is saturated magnetically in the positive magnetization direction can be detected, relatively easily, by monitoring the time transition of the sensing current. At this time, proper threshold values may be provided for the sensing current value, a rate of change thereof, and the like, and the magnetic saturation may be detected if the sensing current value and the like are greater than or equal to the respective threshold values.

According to the current measurement method of the present invention, a sweep cycle including the first controlling process and the second controlling process is repeatedly performed. If one sweep cycle ends, the time transition of the sensing current along a closed B-H characteristic of the core including the hysteresis is recognized. A sweep rate of the sensing current is ideally maintained to be equal between different sweep cycles. By sharing a sweep profile of the sensing current as described above, time values obtained in the past sweep cycle can be applied to the latest sweep cycle without change.

On the other hand, according to the current measurement method of the present invention, the first specifying process, the second specifying process and the calculating process are performed in parallel with the sweep cycle, and the value of the target electric current (hereinafter referred to as a "target electric current value" as occasion demands) is calculated.

The calculation of the target electric current value in the calculating process is performed on the basis of the sensing current at the time point at which the core is demagnetized, as described above. According to the present invention, there are two time points at which the core is demagnetized in one sweep cycle: a time point at which the core is demagnetized when the direction of the magnetic flux density changes from the positive magnetization direction to the negative magnetization direction in the first controlling process: and a time point at which the core is demagnetized when the direction of the magnetic flux density changes from the negative magnetization direction to the positive magnetization direction in the second controlling process.

Here, the values of the sensing current at both the time points do not match, in general, due to an influence of the hysteresis of the core. Thus, if only the sensing current value at one time point is used, accuracy of calculating the target electric current value is influenced by the hysteresis. In the present invention, however, the sensing current values at both the time points are used to calculate the target electric current value. Specifically, the sensing current value at the demagnetization time point in the first controlling process is specified as the first current value, and the sensing current value at the demagnetization time point in the second controlling process is specified as the second current value. In the calculating process, the target electric current value is calculated from the specified first and second current values.

Thus, according to the current measurement method of the present invention, the influence of the hysteresis of the core can be eliminated. Moreover, since the sensing current is swept between the state of the magnetic saturation in the positive magnetization direction and the state of the magnetic saturation in the negative magnetization direction, it is also possible to eliminate an influence of temperature dependence that the core has mainly in the unsaturated area. Therefore, according to the current measurement method of the present invention, the target electric current value can be measured, highly accurately.

By the way, as described above, in the course of changing the magnetic flux density of the core from the state of the magnetic saturation in one magnetization direction to the state of the magnetic saturation in the other magnetization direction, it is generally not easy to know the timing in which the core is demagnetized in real time and with accuracy. Whether or not the sensing current value in the course of the sweep is associated with a time concept, if the core demagnetization timing is not determined under clear criteria, the accuracy of calculating the target electric current value is not stable between the sweep cycles.

In the present invention, the first saturation time is referred to in the first specifying process, and the second saturation time is referred to in the second specifying process. The problem as described above is solved by accurately specifying the first and second current values on the basis of the respective saturation times. The first saturation time is defined to be a time value from the time point at which the magnetic saturation in the positive magnetization direction is detected in the second detecting process, to the time point at which the magnetic saturation in the negative magnetization direction is detected in the first detecting process. The second saturation time is defined to be a time value from the time point at which the magnetic saturation in the negative magnetization direction is detected in the first detecting process, to the time point at which the magnetic saturation in the positive magnetization direction is detected in the second detecting process.

There are many ways to use the first and second saturation times for the specification of the first and second current values, respectively, and various practical aspects can be adopted. However, it is reasonable to consider that there is the core demagnetization time point in the vicinity of a time point corresponding to a half of each of the first and second saturation times, or a time point derived therefrom, in view of the following two points; one point is that the core demagnetization time points in the first and second controlling process are included in time ranges defined by the first and second saturation times, respectively, and the other point is that the B-H characteristic of the core has symmetry with respect to the origin. In other words, the first and second current values can be specified, highly accurately, on the basis of the first and second saturation times.

As described above, according to the current measurement method of the present invention, the magnetic saturation of the core is detected in each sweep process of sweeping the sensing current in the positive magnetization direction to the negative magnetization direction, or in the negative magnetization direction to the positive magnetization direction. On the basis of each saturation time derived from the magnetic saturation, it is possible to estimate the time point at which the core is demagnetized, thereby specifying the sensing current value (first and second current values) required for the core demagnetization. Therefore, it is possible to measure the target electric current value, accurately without an influence of the hysteresis of the B-H characteristic and the temperature dependence of the core, and while suppressing accuracy variations between the different sweep cycles.

Incidentally, the current measurement method of the present invention is performed, for example, by various processors, control apparatuses, computer apparatuses or the like, such as an electronic control unit (ECU), in predetermined conditions in accordance with a control program and a control algorithm set in advance, without an artificial process.

In one aspect of the electric current measurement method of the present invention, the electrically conductive device is an electrically conductive coil wound around the core (claim 2).

According to this aspect, the electrically conductive coil is allowed to function as a type of transformer, and it is thus possible to optimize the sensing current required in the magnetic excitation and demagnetization of the core, in accordance with the number of turns of the electrically conductive coil. Therefore, it is possible to provide high degree of freedom for a configuration of the adjusting device in the magnetic sensor.

In another aspect of the electric current measurement method of the present invention, in said first controlling process, the magnetic saturation of the core in the negative magnetization direction is detected if the value of the sensing current is greater than or equal to a maximum value corresponding to the negative magnetization direction, and in said second controlling process, the magnetic saturation of the core in the positive magnetization direction is detected if the value of the sensing current is greater than or equal to a maximum value corresponding to the positive magnetization direction (claim 3).

According to this aspect, the magnetic saturation of the core is detected if the sensing current is greater than or equal to the maximum value determined in advance, experimentally, experientially, or theoretically. Therefore, the magnetic saturation can be detected, relatively stably.

In another aspect of the electric current measurement method of the present invention, a value of the sensing current at a time point corresponding to a half of the first saturation time in the past is specified as the first current value in said first specifying process, and a value of the sensing current at a time point corresponding to a half of the second saturation time in the past is specified as the second current value in said second specifying process (claim 4).

According to this aspect, the first current value and the second current value in the latest sweep cycle can be alternatively specified, on the basis of the timing determined in the past sweep cycle. Therefore, although the first and second current values are not determined in the latest sweep cycle in the strict sense, the first and second current values can be specified, relatively smoothly. At this time, if a time period of the sweep cycle is sufficiently reduced with respect to a change rate of the target electric current value, there is rarely a significant difference between the first and second saturation times, between the latest sweep cycle and the most recent past sweep cycle, and there is no problem in practice. In particular, if the value in the previous sweep cycle is used, the effect is significant.

On the other hand, according to this aspect, the sensing current value at the time point corresponding to the half of the first saturation time is specified as the first current value, and the sensing current value at the time point corresponding to the half of the second saturation time is specified as the second current value. The current values do not always mean the current values at the time point at which the core is demagnetized in the strict sense; however, the current values are close to the current values at the core demagnetization time point at least to the extent that there is no problem in practice. Therefore, if easiness of the specification and reliability of the values are comprehensively considered, the current values can be useful reference values.

Incidentally, in the configuration in which the past values are used as described above, there may be provided a process of holding the values of the first and second saturation times by the predetermined number of cycles in the past, respectively. By providing the holding process as described above, the values of the first and second saturation times in the past can be easily used to specify the first and second current values, respectively. Moreover, in a configuration in which a plurality of sample values are held, it is also possible to judge whether or not the held sample values include an abnormal value, and it is possible to reduce a possibility that the target electric current is incorrectly calculated on the basis of the abnormal value.

In another aspect of the electric current measurement method of the present invention, the target electric current is an electric current which flows through an inverter for a vehicle (claim 5).

For example, in a vehicle having a high-power device such as a three-phase alternating current motor, as a power source of the vehicle such as a hybrid vehicle and an electric vehicle, power supply to the high-power device is performed via an electric power control unit including an inverter. In the application as described above, it is necessary to accurately gauge a driving current of the inverter. From a point of high power consumption and considerable heat in operation, and a point of limited installation space, it is necessary to realize space-saving, high-precision current detection with low temperature dependence and less influence of the hysteresis. From such a viewpoint, the current measurement method of the present invention is significantly effective for the measurement of the driving current of the inverter for the vehicle of this type.

The nature, utility, and further features of this invention will be more clearly apparent from the following detailed description with reference to a preferred embodiment of the invention when read in conjunction with the accompanying drawings briefly described below.

DETAILED DESCRIPTION OF THE PREFERRED EMBODIMENT

<Embodiment of the Invention>

Hereinafter, a preferred embodiment of the present invention will be explained with reference to the drawings.

<Configuration of Embodiment>

Figure 1:
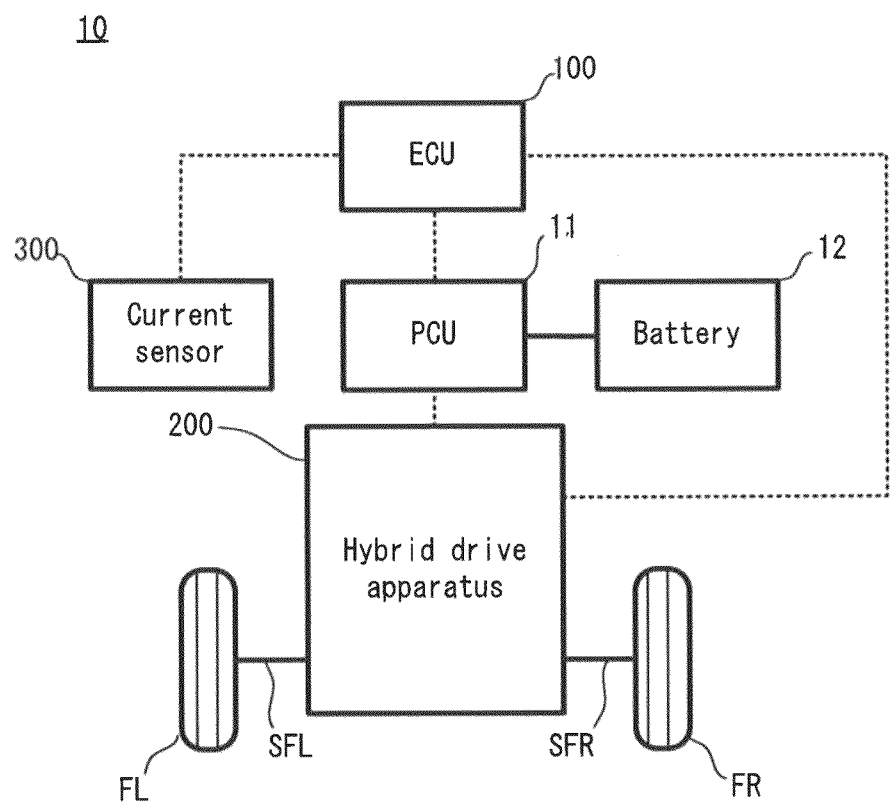
FIG. 1 is a schematic configuration diagram conceptually showing a configuration of a hybrid vehicle in an embodiment of the present invention.

Firstly, with reference to FIG. 1, a configuration of a hybrid vehicle 10 in a first embodiment of the present invention will be explained. FIG. 1 is a schematic configuration diagram conceptually showing the configuration of the hybrid vehicle 10.

In FIG. 1, the hybrid vehicle 10 is provided with an electronic control unit (ECU) 100, a power control unit (PCU) 11, a battery 12, a hybrid drive apparatus 200, and a current sensor 300.

The ECU 100 is provided with a CPU, a ROM, a RAM, and the like. The ECU 100 is an electronic control unit configured to control the entire operation of the hybrid vehicle 10. The ECU 100 performs inverter current calculation control processing described later in accordance with a control program stored in the ROM, thereby functioning as an execution entity for realizing each of the "first control process", the "first detecting process", the "second control process," the "second detecting process", the "first specifying process", the "second specifying process", and the "calculating process" in the present invention.

The PCU 11 includes a not-illustrated inverter which can convert direct-current (DC) power extracted from the battery 12 to alternating-current (AC) power and supply it to a motor generator MG1 and a motor generator MG2 as one power source of the hybrid vehicle 10, and which can convert AC power generated by the motor generator MG1 and the motor generator MG2 to DC power and supply it to the battery 12. The PCU 11 is a control unit configured to control the input/output of the electric power between the battery 12 and each motor generator, or the input/output of the electric power between the motor generators (i.e. in this case, the exchange of the electric power between the motor generators is performed without via the battery 12). The PCU 11 is electrically connected to the ECU 100, and the operations of the PCU 11 are controlled by the ECU 100.

The battery 12 is a chargeable storage battery device which functions as an electric power supply associated with the electric power for performing power running of the motor generator MG1 and the motor generator MG2.

The hybrid drive apparatus 200 is a power train of the hybrid vehicle 10, including power sources including an engine and the motor generators MG1 and MG2, and a planetary gear mechanism for mechanically controlling power transmission between the power source and an axle. Incidentally, a configuration of the hybrid drive apparatus 200 has a weak association with the current measurement method of the present invention, and the detailed explanation thereof will be thus omitted.

Figure 2:
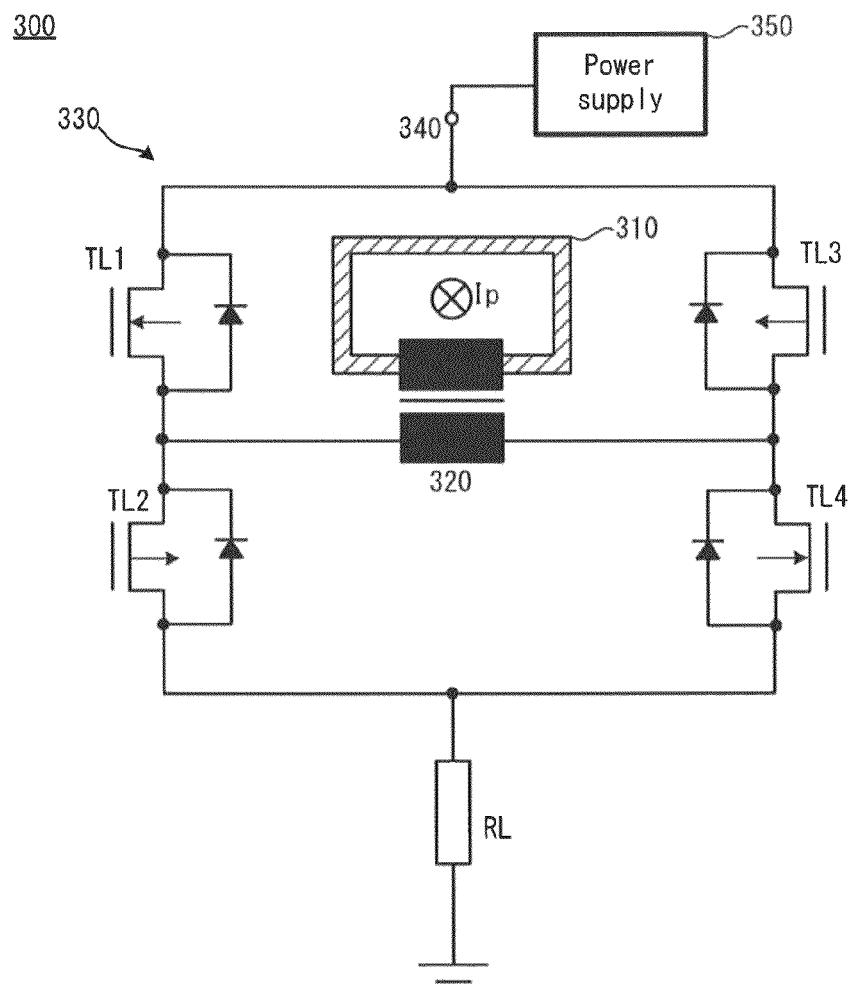
FIG. 2 is a schematic configuration diagram conceptually showing a configuration of a current sensor in the hybrid vehicle illustrated in FIG. 1.

The current sensor 300 is one example of the "magnetic current sensor" of the present invention and is a sensor for detecting an inverter current Ip (one example of the "target electric current" of the present invention) which is a driving current of the inverter provided for the PCU 11. Now, with reference to FIG. 2, a configuration of the current sensor 300 will be explained. FIG. 2 is a schematic configuration diagram conceptually showing the configuration of the current sensor 300.

In FIG. 2, the current sensor 300 is provided with a core 310, a coil 320, a switching circuit 330, a terminal 340, a power supply 350, and a load resistance RL. Incidentally, in the embodiment, the ECU 100 is configured to control the current sensor 300 to measure the inverter current Ip; however, the current sensor 300 may be provided with a processor and may be configured to perform processing corresponding to the inverter current calculation control processing described later using the processor.

The core 310 is a toroidal magnetic body made of a magnetic material (ferrite). The core 310 has such a configuration that a current wire of the inverter of the PCU 11 (for convenience, the number of turns, ns=1) passes through an air core portion and is configured to generate magnetic flux in a magnetic flux density B in a circumferential direction thereof by the action of a magnetic field generated by the inverter current Ip.

Figure 3:
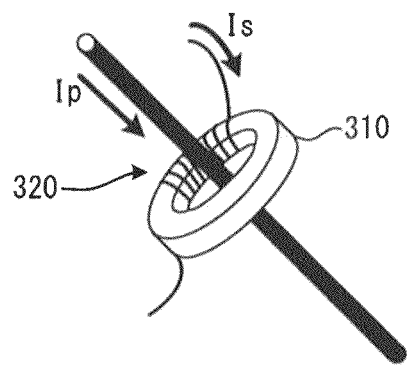
FIG. 3 is a schematic configuration diagram conceptually showing configurations of a core and a coil in the current sensor illustrated in FIG. 2.

The coil 320 is one example of the "electrically conductive coil" of the present invention, obtained by winding a wire member made of an electrically conductive material, such as metal, with the number of turns, ns. Now, with reference to FIG. 3, the core 310 and the coil 320 will be detailed. FIG. 3 is a schematic configuration diagram conceptually showing configurations of the core 310 and the coil 320.

In FIG. 3, the coil 320 is wound around the core 310 as illustrated. In the core 310, a sensing current Is flows in accordance with a drive voltage Vc and a gate voltage Vg described later. If the sensing current Is flows, the magnetic flux is generated in the core 310 in the same direction as a magnetization direction caused by the inverter current Ip (the "positive magnetization direction" of the present invention) or in a direction opposite to the magnetization direction caused by the inverter current Ip (the "negative magnetization direction" of the present invention) in accordance with a direction and magnitude of the sensing current Is, and the magnetic flux density B changes. Incidentally, an inner circumferential length of the core 310 is 1 c.

Back in FIG. 2, the switching circuit 330 is a known H-bridge switching circuit, provided with transistors TL1 and TL4, each of which is an N-channel MOSFET, transistors TL2 and TL3, each of which is a P-channel MOSFET, and electrical wiring. To a gate terminal of each transistor, the gate voltage Vg is applied from a not-illustrated power system. The power system is electrically connected to the ECU 100.

The switching circuit 330 is connected between the terminal 340 and the load resistance RL as illustrated. The ECU 100 applies the predetermined gate voltage Vg via the power system in a condition that the drive voltage Vc is applied from the power supply 350. By this, the sensing current Is according to the state of the core 310 can be applied to the core 320 in a direction determined in accordance with a switching state of the switching circuit 330.

Incidentally, in the embodiment, the gate voltage is on-off controlled; however, the gate voltage can be linearly controlled as the configuration of the switching circuit 330.

The power supply 350 is a power supply device capable of supplying the drive voltage Vc to the current sensor 300. The power supply 350 is electrically connected to the ECU 100, and polarity and magnitude of the drive voltage Vc are controlled by the ECU 100.

Figures 4A, 4B:
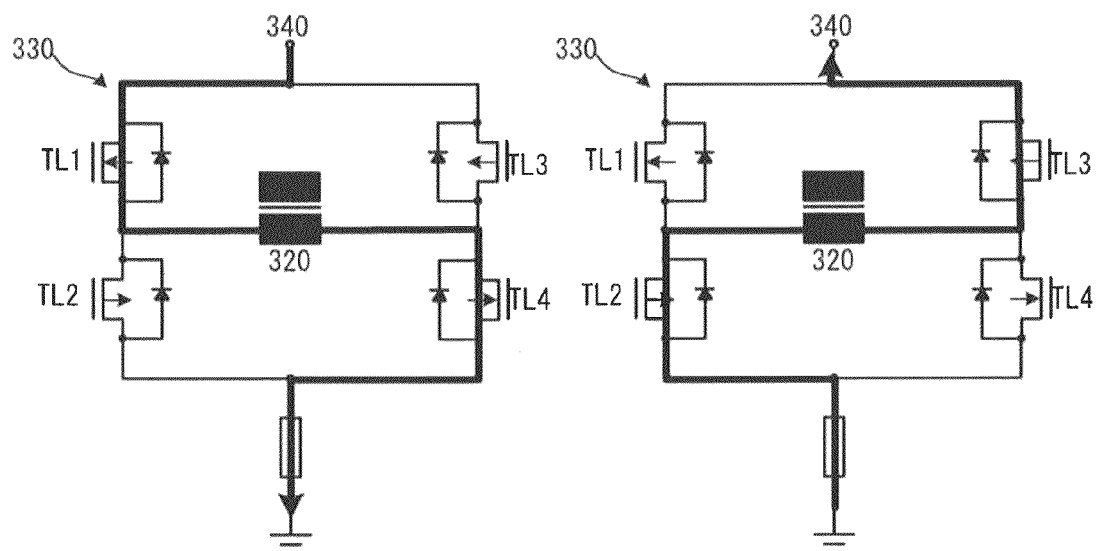
FIG. 4A to FIG. 4C are schematic circuit diagrams explaining a relation between a switching state of a switching circuit in the current sensor illustrated in FIG. 2 and a direction of a sensing current Is.
Figure 4C:
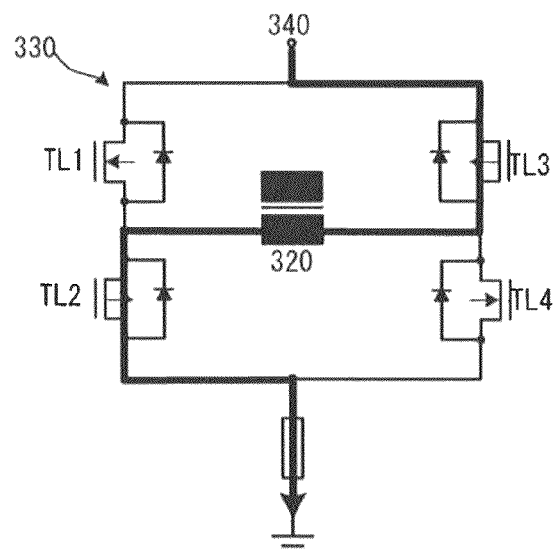

Now, with reference to FIG. 4A to FIG. 4C, the switching state of the switching circuit 330 will be explained. FIG. 4A to FIG. 4C are schematic circuit diagrams explaining a relation between the switching state of the switching circuit 330 and the direction of the sensing current Is. Incidentally, in FIG. 4A to FIG. 4C, portions overlapping those of FIG. 2 will carry the same reference numerals, and the explanation thereof will be omitted as occasion demands.

FIG. 4A illustrates a first switching state, FIG. 4B illustrates a second switching state, and FIG. 4C illustrates a third switching state.

In a condition that the positive drive voltage Vc is applied via the terminal 340, if the ECU 100 applies to each transistor a positive voltage having an absolute value which is greater than or equal to a threshold value as the gate voltage Vg, the transistors TL1 and TL4, each of which is the N-channel MOSFET, become active, and the transistors TL2 and TL3, each of which is the P-channel MOSFET, become inactive, and the first switching state is realized. In the first switching state, the sensing current Is flows via the transistor TL1, the coil 320, and the transistor TL4 in this order. Incidentally, the direction of the sensing current Is in the first switching state is directed to magnetically excite the core 310 in the negative magnetization direction.

In a condition that the negative drive voltage Vc is applied via the terminal 340, if the ECU 100 applies to each transistor a negative voltage having the absolute value which is greater than or equal to the threshold value as the gate voltage Vg, the transistors TL2 and TL3, each of which is the P-channel MOSFET, become active, and the transistors TL1 and TL4, each of which is the N-channel MOSFET, become inactive, and the second switching state is realized. In the second switching state, the sensing current Is flows via the transistor TL2, the coil 320, and the transistor TL3 in this order. In other words, if the switching state is changed from the first switching state to the second switching state, the direction of the sensing current Is is reversed. Incidentally, the direction of the sensing current Is in the second switching state is directed to magnetically excite the core 310 in the positive magnetization direction.

In the condition that the positive drive voltage Vc is applied via the terminal 340, if the ECU 100 applies to each transistor the negative voltage having the absolute value which is greater than or equal to the threshold value as the gate voltage Vg, the transistors TL2 and TL3, each of which is the P-channel MOSFET, become active, and the transistors TL1 and TL4, each of which is the N-channel MOSFET, become inactive, and the third switching state is realized. In the third switching state, the sensing current Is flows via the transistor TL3, the coil 320, and the transistor TL2 in this order. In other words, if the switching state is changed from the second switching state to the third switching state, the direction of the sensing current Is is reversed. Incidentally, the direction of the sensing current Is in the third switching state is directed to magnetically excite the core 310 in the negative magnetization direction.

<Operation of Embodiment>

Hereinafter, the operation of the embodiment will be explained.

Figure 5:
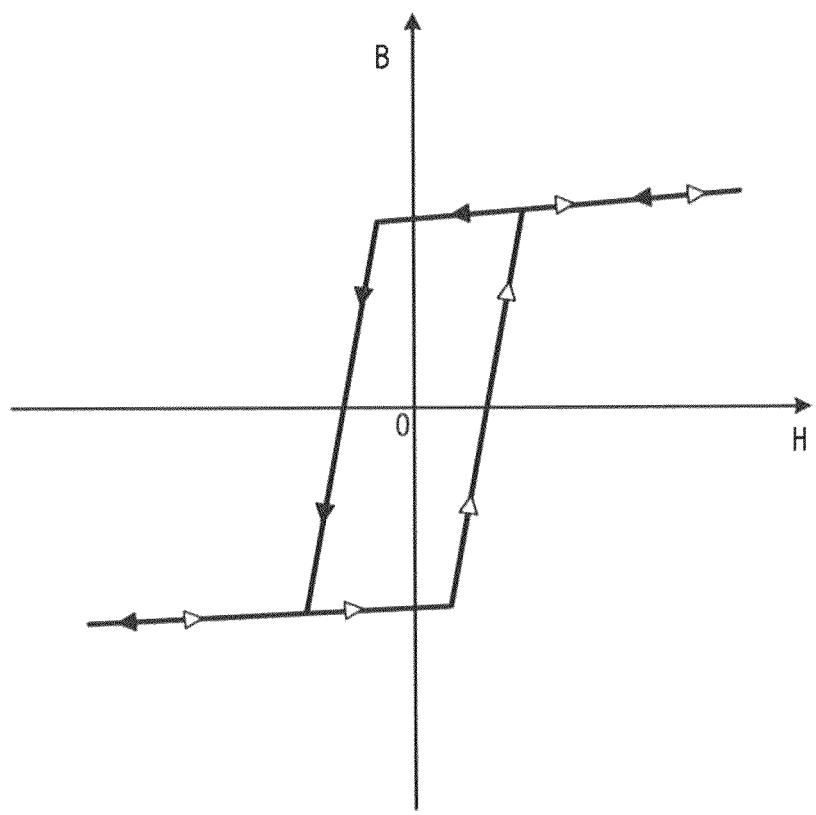
FIG. 5 is a diagram illustrating a B-H characteristic of the core in the current sensor illustrated in FIG. 2.

Firstly, with reference to FIG. 5, a B-H characteristic of the core 310 in the current sensor 300 will be explained. FIG. 5 is a diagram illustrating the B-H characteristic of the core 310.

In FIG. 5, if a vertical axis represents the magnetic flux density B and a horizontal axis represents magnetic field strength H, the B-H characteristic of the core 310 is as illustrated by a solid line.

Here, arrow marks (white marks and black marks) disposed on the B-H characteristic mean sweep directions of the sensing current Is. The sweep direction defined by the black marks corresponds to the first and third switching states described above in the switching circuit 330. The sweep direction defined by the white marks corresponds to the second switching state. As illustrated, there is a hysteresis in the B-H characteristic of the core 310. In the embodiment, it is possible to perform high-precision current measurement which eliminates an influence of the hysteresis.

Figure 6:
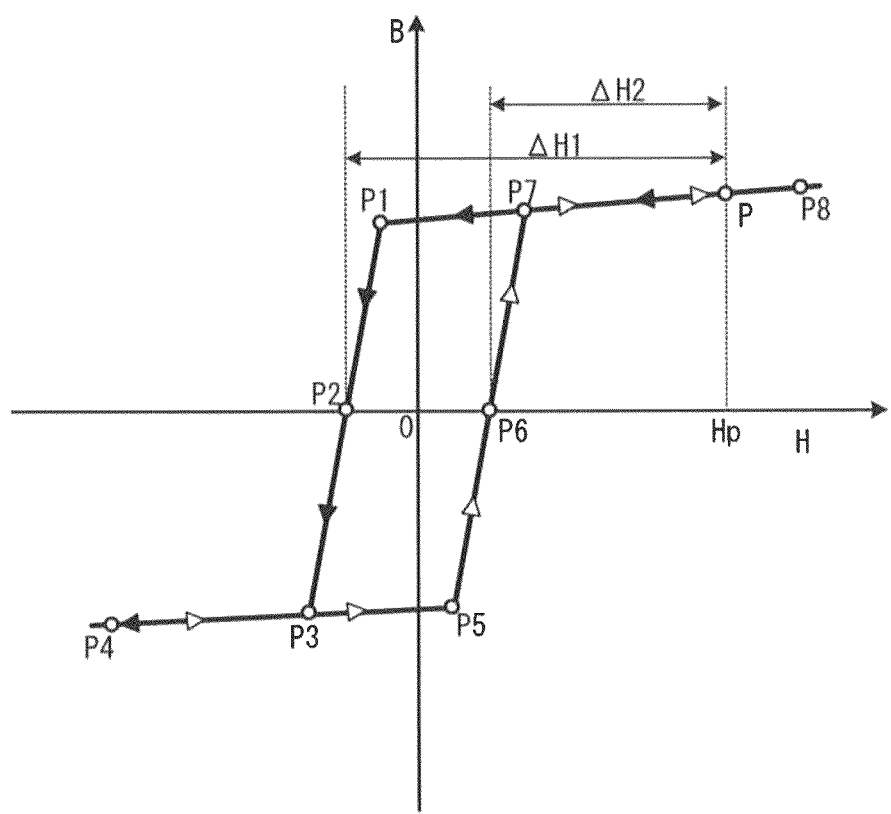
FIG. 6 is a diagram explaining a principle of calculating an inverter current in the current sensor illustrated in FIG. 2.

Next, with reference to FIG. 6, the method of measuring the inverter current Ip in the current sensor 330 will be explained. FIG. 6 is a diagram explaining a principle of calculating the inverter current Ip. Incidentally, in FIG. 6, portions overlapping those of FIG. 5 will carry the same reference numerals, and the explanation thereof will be omitted as occasion demands.

In FIG. 6, it is assumed that a state of the core 310 is a state corresponding to an illustrated state point P (white circle) (hereinafter referred to as a "state P" as occasion demands, for convenience, and the same shall apply in other state points) if the sensing current Is =0 with respect to an operational state at a certain time point (i.e. the inverter current Ip) of the inverter which is a measurement target. In the state P, the core 310 has a magnetic field Hp generated in accordance with the inverter current Ip.

Here, if the switching state of the switching circuit 330 is set to the first switching state described above and the sensing current Is is swept in the negative magnetization direction of the core 310, the state of the core 310 changes in accordance with a B-H curve of the core 310 in the direction illustrated by the black marks described above. In other words, the state of the core 310 changes from the illustrated state P via a state P1, a state P2, and a state P3 to a state P4.

An area from the state P to the state P1 is a positively saturated area in which the core 310 is saturated magnetically in the positive magnetization direction. An area from the state P3 to the state P4 is a negatively saturated area in which the core 310 is saturated magnetically in the negative magnetization direction. Moreover, an area from the state P1 to the state P3 is an unsaturated area in which the core 310 is not saturated magnetically. In the unsaturated area, the magnetic flux density B changes linearly to the magnetic field H. Moreover, in the unsaturated area, the magnetic flux density B changes in a direction of canceling a change in the sensing current Is, and the sensing current Is to be swept thus hardly changes.

On the other hand, if the switching state of the switching circuit 330 is set to the second switching state described above and the sensing current Is is swept in the positive magnetization direction of the core 310, the state of the core 310 changes in accordance with a B-H curve of the core 310 in the direction illustrated by the white marks described above. In other words, the state of the core 310 changes from the illustrated state P4 via the state P3, a state P5, a state P6, and a state P7 to a state P8.

An area from the state P4 to the state P5 is the negatively saturated area in which the core 310 is saturated magnetically in the negative magnetization direction. An area from the state P7 to the state P8 is the positively saturated area in which the core 310 is saturated magnetically in the positive magnetization direction. Moreover, an area from the state P5 to the state P7 is the unsaturated area in which the core 310 is not saturated magnetically. In the unsaturated area, the magnetic flux density B changes linearly to the magnetic field H. Moreover, in the unsaturated area, the magnetic flux density B changes in the direction of canceling the change in the sensing current Is, and the sensing current Is to be swept thus hardly changes.

Here, in the course that the sensing current Is is swept as described above, the core 310 becomes in a demagnetization state twice. In other words, the demagnetization state is the illustrated state P2 passed when the sensing current Is is swept in the negative magnetization direction, and the illustrated state P6 passed when the sensing current Is is swept in the positive magnetization direction.

In the state P2 and the state P6, the magnetic flux generated originally by the inverter current Ip is demagnetized by the sensing current Is, and the sensing current Is can be considered a replacement for the inverter current Ip. Specifically, if a deviation between strength Hp of the magnetic field generated by the inverter current Ip and magnetic field strength in the state P2 is set to $\Delta H1$ and a deviation between the strength Hp of the magnetic field generated by the inverter current Ip and magnetic field strength in the state P6 is set to $\Delta H2$, a relation of the following equation (1) applies to Hp, $\Delta H1$ and $\Delta H2$.

$$Hp = (\Delta H1 + \Delta H2)/2 \qquad (1)$$

On the other hand, Hp, $\Delta H1$ and $\Delta H2$ are represented by the following equations (2), (3) and (4), respectively. Incidentally, Is1 in the equation (3) is a sensing current value in the state P2 and is one example of the "first current value" of the present invention. Moreover, Is2 in the equation (4) is a sensing current value in the state P6 and is one example of the "second current value" of the present invention. Hereinafter, Is1 and Is2 are written as a "first current value Is1" and a "second current value Is2", respectively, as occasion demands.

$$Hp = Ip \cdot nc/1c \qquad (2)$$

$$\Delta H1 = Is1 \cdot ns/1c \qquad (3)$$

$$\Delta H2 = Is2 \cdot ns/1c \qquad (4)$$

On the other hand, if the equations (2), (3) and (4) are substituted for the equation (1), the following equation (5) is obtained.

$$Ip = (ns/np) \cdot (Is1 + Is2)/2 \qquad (5)$$

Incidentally, since np is set to 1 in the embodiment, the inverter current Ip can be obtained if the number of turns, ns, of the coil 320, the first current value Is1 and the second current value Is2 are known. In the embodiment, the ECU 100 is configured to calculate the inverter current Ip according to the principle, in the inverter current calculation control processing. Incidentally, arithmetic processing according to the equation (5) is one example of the "calculating process" of the present invention.

According to the method, the B-H characteristic of the core 310 is used in both the positive magnetization direction and the negative magnetization direction, and the influence of the hysteresis can be thus eliminated. Moreover, the sensing current Is is swept from a magnetically saturated state in one magnetization direction to a magnetically saturated state in the other magnetization direction, and thus, an influence of thermal properties of the core 310 can be also eliminated.

On the other hand, as illustrated in the equation (5), the first current value Is1 and the second current value Is2 are required to calculate the inverter current Ip. However, it is not easy to detect the magnetic flux density of the core 310, and it is more difficult to directly detect timing in which the core 310 is demagnetized. Thus, in the embodiment, the first current value Is1 and the second current value Is2 are specified in the following manner.

Figure 7:
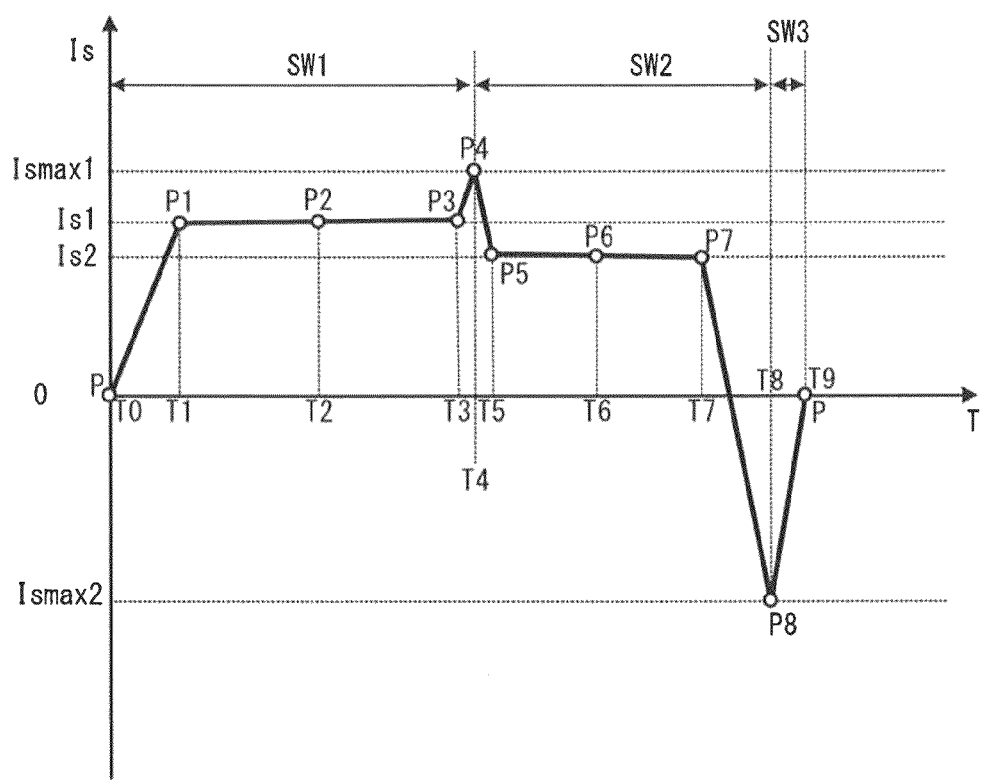
FIG. 7 is a conceptual diagram illustrating inverter current calculation control processing performed by an ECU.

Now, with reference to FIG. 7, an explanation will be given to a time transition of the sensing current Is in the inverter current calculation control processing. FIG. 7 is a conceptual diagram illustrating the inverter current calculation control processing. Incidentally, in FIG. 7, portions overlapping those of FIG. 6 will carry the same reference numerals, and the explanation thereof will be omitted as occasion demands.

In FIG. 7, a vertical axis represents the sensing current Is, and a horizontal axis represents time T. Now, it is assumed that the inverter current calculation control processing is started at a time point T0. Incidentally, at the time point T0, the core 310 is in the state P. In other words, the material and shape of the core 310 is designed in advance such that the core 310 is saturated magnetically in the positive magnetization direction in a possible range of the inverter current Ip.

The ECU 100 sets the switching state of the switching circuit 330 to the first switching state. If the sweep of the sensing current Is in the negative magnetization direction is started by the switching circuit 330 in the first switching state, the magnetization state of the core 310 transitions from the magnetically saturated state in the positive magnetization direction to an unsaturated state (the state P1) at a time point T1. In the unsaturated state, the magnetic flux density B changes in a direction of suppressing the change in the sensing current Is, and the sensing current Is thus hardly changes.

On the other hand, at a time point T2, the core 310 becomes in the state P2 described above in which the magnetic flux density B is zero, and the core 310 is magnetically excited in the negative magnetization direction due to the further sweep of the sensing current Is. The magnetic excitation causes the core 310 to be saturated magnetically in the negative magnetization direction (the state P3) at a time point T3. From the time point of the magnetic saturation in the negative magnetization direction, the sensing current Is starts to increase sharply.

At a time point T4, when the sensing current Is, which starts to increase sharply from the time point T3, reaches a maximum value Ismax1 set in the negative magnetization direction in advance, it is detected that the core 310 is saturated magnetically in the negative magnetization direction. In other words, at the time point T4, one example of the "first detecting process" of the present invention is performed. The sweep control of the sensing current Is from the time point T0 to the time point T4 is one example of the "first controlling process" of the present invention.

If the magnetic saturation in the negative magnetization direction is detected at the time point T4, the switching state of the switching state 330 is changed from the first state to the second switching state by the ECU 100, and the direction of the sensing current Is is reversed into the positive magnetization direction. In other words, one example of the "second controlling process" of the present invention is started.

If the sweep of the sensing current Is in the positive magnetization direction is started, the magnetization state of the core 310 becomes in the state P5 at a time point T5, and the core 310 becomes in the unsaturated state. Therefore, for a short time after the time point T5, the value of the On the other hand, at a time point T6, the core 310 becomes in the state P6 described above in which the magnetic flux density B is zero, and the core 310 is magnetically excited again in the positive magnetization direction due to the further sweep of the sensing current Is. The magnetic excitation causes the core 310 to be saturated magnetically in the positive magnetization direction (the state P7) at a time point T7. From the time point of the magnetic saturation, the sensing current Is starts to change sharply.

At a time point T8, when the sensing current Is, which starts to change sharply from the time point T7, reaches a maximum value Ismax2 set in the positive magnetization direction in advance, it is detected that the core 310 is saturated magnetically in the positive magnetization direction. In other words, at the time point T8, one example of the "second detecting process" of the present invention is performed. Moreover, the sweep control of the sensing current Is from the time point T4 to the time point T8 is one example of the "second controlling process" of the present invention.

If the magnetic saturation in the positive magnetization direction is detected at the time point T8, the switching state of the switching state 330 is changed to the third switching state by the ECU 100, and the direction of the sensing current Is is reversed again into the negative magnetization direction. In other words, one example of the "first controlling process" of the present invention is started again. In the course of sweeping the sensing current in the negative magnetization direction in the third switching state, if the sensing current Is becomes zero again, the ECU 100 changes the switching state of the switching circuit 330 from the third switching state to the first switching state. The processing after the time point T0 is repeated.

As described above, in the embodiment, a sweep cycle SWP is repeatedly performed, wherein the sweep cycle SWP includes a sweep of the sensing current Is which is continued from a time point at which the magnetic saturation in the positive magnetization direction is detected (only in the first cycle, a time point of Is=0) to a time point at which the magnetic saturation in the negative magnetization direction is detected (the first controlling process), and a sweep of the sensing current Is which is continued from a time point at which the magnetic saturation in the negative magnetization direction is detected to a time point at which the magnetic saturation in the positive magnetization direction is detected (the second controlling process).

Here, the first current value Is1 is the sensing current value in the state P2, i.e. at the time point T2. Therefore, if the time point T2 can be found, the value of the sensing current Is at that time point can be specified as the first current value Is1. Here, in particular, the time point T2 is, on the premise of an ideal B-H characteristic, a time point corresponding to a midpoint of the time point T1, which corresponds to a boundary point between the positively saturated area and the unsaturated area, and the time point T3, which corresponds to a boundary point between the unsaturated area and the negatively saturated area. However, a load to accurately detect the boundary points in every sweep cycle is not small.

Thus, in the embodiment, in finding the time point T2, a first saturation time ts1 (one example of the "first saturation time" of the present invention) is used, wherein the first saturation time ts1 is a time length from the time point T8 at which it is detected that the core 310 is saturated magnetically in the positive magnetization direction in the second controlling process to the time point T4 at which it is detected that the core 310 is saturated magnetically in the negative magnetization direction in the first controlling process. More specifically, a time point after a lapse of a time corresponding to a half of the first saturation time ts1 from the time point T8 is specified as the time point T2, and the sensing current value at the time point T2 is specified as the first current value Is1.

In one sweep cycle, the time point T4 is after the time point T2, and the first saturation time ts1 thus cannot be specified in one sweep cycle. Therefore, as values of the time point T4 and the time point T8, values in a sweep cycle one cycle before the present cycle (i.e. in a past sweep cycle) are used. Incidentally, since the time values in the past sweep cycle are used, the ECU 100 holds the values of the time point T4 and the time point T8 regarding the past several cycles, in a built-in volatile memory.

Specifically, it is assumed that a time identifier is given to the sweep cycle SWP, that the sweep cycle at the current time point is represented by SWP(i), that the previous sweep cycle is represented by SWP(i−1), and that the next sweep cycle is represented by SWP(i+1). In this case, the first saturation time ts1 used to specify the time point corresponding to the time point T2 in the sweep cycle SWP(i) is a first saturation time one cycle before, ts1(i−1), which is from a time point T8(i−2) at which the magnetic saturation in the positive magnetization direction is detected in the second controlling process (the sweep of the sensing current from the negatively saturated area to the positively saturated area) in a sweep cycle two cycle before the present cycle, SWP(i−2) (i.e. a start time point of the sweep cycle one cycle before, SWP(i−1)), to a time point T4(i−1) at which the magnetic saturation in the negative magnetization direction is detected in the sweep cycle one cycle before.

As described above, according to the embodiment, the use of the values in the previous sweep cycle (one cycle before the present cycle) enables the first current value Is1, which is the sensing current value when the core 310 is in the demagnetization state, to be obtained with high accuracy and good reproducibility in the latest sweep cycle. Thus, the inverter current Ip can be calculated, highly accurately. Incidentally, the inverter current Ip rarely significantly changes in the sweep cycles close to each other on a time series. Thus, even if the past time values are used, the accuracy of calculating the inverter current does not decrease in practice.

On the other hand, the second current value Is2 is the sensing current value in the state P6, i.e. at the time point T6. Therefore, if the time point T6 can be found, the value of the sensing current Is at that time point can be specified as the second current value Is2. Here, in particular, the time point T6 is, on the premise of the ideal B-H characteristic, a time point corresponding to a midpoint of the time point T5, which corresponds to a boundary point between the negatively saturated area and the unsaturated area, and the time point T7, which corresponds to a boundary point between the unsaturated area and the positively saturated area. However, the load to accurately detect the boundary points in every sweep cycle is not small.

Thus, in the embodiment, in finding the time point T6, a second saturation time ts2 (one example of the "second saturation time" of the present invention) is used, wherein the second saturation time ts2 is a time length from the time point T4 at which it is detected that the core 310 is saturated magnetically in the negative magnetization direction in the first controlling process to the time point T8 at which it is detected that the core 310 is saturated magnetically in the positive magnetization direction in the second controlling process. More specifically, a time point after a lapse of a time corresponding to a half of the second saturation time ts2 from the time point T4 is specified as the time point T6, and the sensing current value at the time point T6 is specified as the second current value Is2.

In one sweep cycle, the time point T8 is after the time point T6, and the second saturation time ts2 thus cannot be specified in one sweep cycle. Therefore, as values of the time point T4 and the time point T8, the values in the sweep cycle one cycle before (i.e. in the past sweep cycle) are used.

That is, if the time identifier is given to the sweep cycle SWP, if the sweep cycle at the current time point is represented by SWP(i), if the previous sweep cycle is represented by SWP(i−1), and if the next sweep cycle is represented by SWP(i+1), then, the second saturation time ts2 used to specify the time point corresponding to the time point T6 in the sweep cycle SWP(i) is a second saturation time one cycle before, ts2(i−1), which is from a time point T4(i−1) at which the magnetic saturation in the negative magnetization direction is detected in the sweep cycle one cycle before, to a time point T8(i−1) at which the magnetic saturation in the positive magnetization direction is detected in the sweep cycle one cycle before.

As described above, according to the embodiment, the use of the values in the previous sweep cycle (one cycle before the present cycle) enables the second current value Is2, which is the sensing current value when the core 310 is in the demagnetization state, to be obtained with high accuracy and good reproducibility in the latest sweep cycle. Thus, the inverter current Ip can be calculated, highly accurately. Incidentally, the inverter current Ip rarely significantly changes in the sweep cycles close to each other on the time series. Thus, even if the past time values are used, the accuracy of calculating the inverter current does not decrease in practice.

Figure 8:
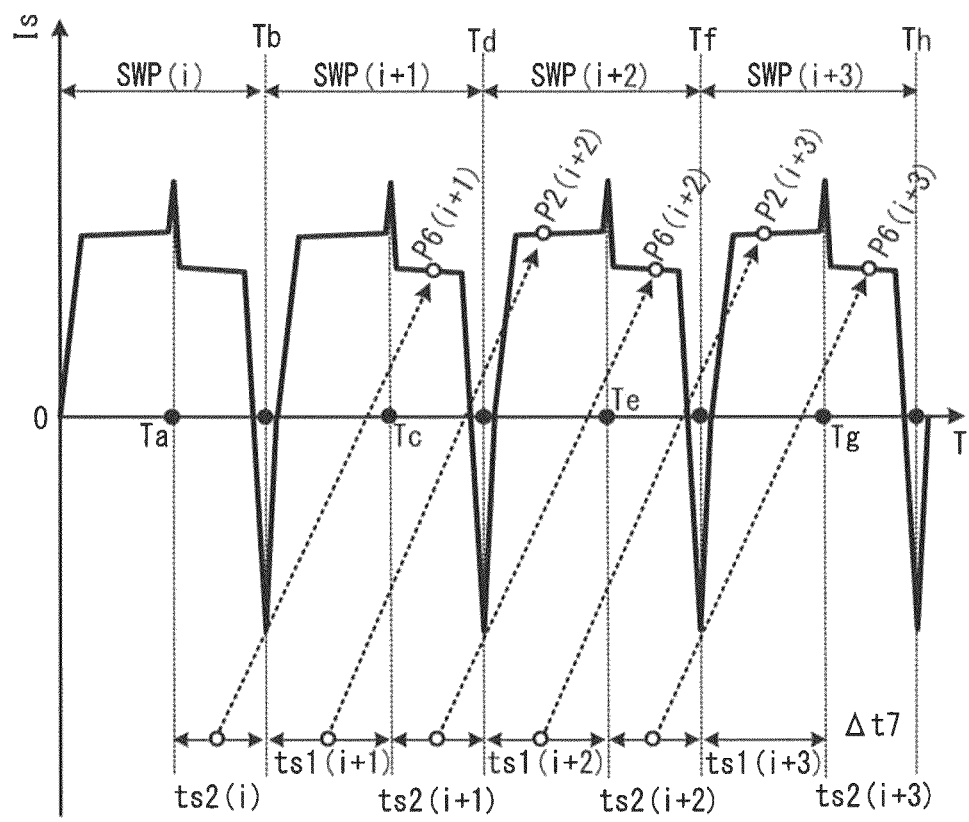
FIG. 8 is a timing chart illustrating a time transition of the sensing current in the course of performing the inverter current calculation control processing.

Now, with reference to FIG. 8, an explanation will be given to the actual specification of the first current value Is1 (i.e. the state P2) and the second current value Is2 (i.e. the state P6) in the course of performing the inverter current calculation control processing. FIG. 8 is a timing chart illustrating a time transition of the sensing current in the course of performing the inverter current calculation control processing. Incidentally, in FIG. 8, portions overlapping those of FIG. 7 will carry the same reference numerals, and the explanation thereof will be omitted as occasion demands.

In FIG. 8, a vertical axis represents the sensing current Is, and a horizontal axis represents time T. A period from a time point 0 to a time point Tb corresponds to the sweep cycle SWP(i). A period from the time point Tb to a time point Td corresponds to the sweep cycle SWP(i+1). A period from the time point Td to a time point Tf corresponds to the sweep cycle SWP(i+2). A period from the time point Tf to a time point Th corresponds to the sweep cycle SWP(i+3).

In FIG. 8, a time point at which the magnetic saturation in the negative magnetization direction is detected in the sweep cycle SWP(i) is a time point Ta, and a time point at which the magnetic saturation in the positive magnetization direction is detected in the same cycle is the time point Tb. In other words, a second saturation time ts2(i) specified in the sweep cycle SWP(i) is a time length from the time point Ta to the time point Tb. The second saturation time ts2(i) specified in the sweep cycle SWP(i) is used for the sweep cycle SWP(i+1) which is the next cycle. More specifically, in the sweep cycle SWP(i+1), the core 310 is supposedly in a state P6(i+1) (i.e. in the demagnetization state) at a time point after a lapse of a time corresponding to a half of the second saturation time ts2(i) from a time point Tc at which the magnetic saturation in the negative magnetization direction is detected. The value of the sensing current Is at this time point is specified as a second current value Is2(i+1).

Moreover, a time point at which the magnetic saturation in the negative magnetization direction is detected in the sweep cycle SWP(i+1) is the time point Tc, and a time point at which the magnetic saturation in the positive magnetization direction is detected in the same cycle is the time point Td. In other words, a second saturation time ts2(i+1) specified in the sweep cycle SWP(i+1) is a time length from the time point Tc to the time point Td. The second saturation time ts2(i+1) specified in the sweep cycle SWP(i+1) is used for the sweep cycle SWP(i+2) which is the next cycle. More specifically, in the sweep cycle SWP(i+2), the core 310 is supposedly in a state P6(i+2) (i.e. in the demagnetization state) at a time point after a lapse of a time corresponding to a half of the second saturation time ts2(i+1) from a time point Te at which the magnetic saturation in the negative magnetization direction is detected. The value of the sensing current Is at this time point is specified as a second current value Is2(i+2).

Moreover, a time point at which the magnetic saturation in the negative magnetization direction is detected in the sweep cycle SWP(i+2) is the time point Te, and a time point at which the magnetic saturation in the positive magnetization direction is detected in the same cycle is the time point Tf. In other words, a second saturation time ts2(i+2) specified in the sweep cycle SWP(i+2) is a time length from the time point Te to the time point Tf. The second saturation time ts2(i+2) specified in the sweep cycle SWP(i+2) is used for the sweep cycle SWP(i+3) which is the next cycle. More specifically, in the sweep cycle SWP(i+3), the core 310 is supposedly in a state P6(i+3) (i.e. in the demagnetization state) at a time point after a lapse of a time corresponding to a half of the second saturation time ts2(i+2) from a time point Tg at which the magnetic saturation in the negative magnetization direction is detected. The value of the sensing current Is at this time point is specified as a second current value Is2(i+3).

Moreover, a time point at which the magnetic saturation in the negative magnetization direction is detected in the sweep cycle SWP(i+3) is the time point Tg, and a time point at which the magnetic saturation in the positive magnetization direction is detected in the same cycle is the time point Th. In other words, a second saturation time ts2(i+3) specified in the sweep cycle SWP(i+3) is a time length from the time point Tg to the time point Th. The second saturation time ts2(i+3) specified in the sweep cycle SWP(i+3) is also used for the sweep cycle SWP(i+4) (not illustrated) which is the next cycle, in the same manner.

On the other hand, in FIG. 8, a time point at which the magnetic saturation in the positive magnetization direction is detected in the sweep cycle SWP(i) (i.e. a time point as a base point of the sweep cycle SWP(i+1)) is the time point Tb, and a time point at which the magnetic saturation in the negative magnetization direction is detected in the sweep cycle SWP(i+1) is the time point Tc. In other words, a first saturation time ts1(i+1) specified in the sweep cycle SWP(i+1) is a time length from the time point Tb to the time point Tc. The first saturation time ts1(i+1) specified in the sweep cycle SWP(i+1) is used for the sweep cycle SWP(i+2) which is the next cycle. More specifically, in the sweep cycle SWP(i+2), the core 310 is supposedly in a state P2(i+2) (i.e. in the demagnetization state) at a time point after a lapse of a time corresponding to a half of the first saturation time ts1(i+1) from the time point Td at which the magnetic saturation in the positive magnetization direction is detected. The value of the sensing current Is at this time point is specified as a first current value Is1(i+2).

Moreover, a time point at which the magnetic saturation in the positive magnetization direction is detected in the sweep cycle SWP(i+1) (i.e. a time point as a base point of the sweep cycle SWP(i+2)) is the time point Td, and a time point at which the magnetic saturation in the negative magnetization direction is detected in the sweep cycle SWP(i+2) is the time point Te. In other words, a first saturation time ts1(i+2) specified in the sweep cycle SWP(i+2) is a time length from the time point Td to the time point Te. The first saturation time ts1(i+2) specified in the sweep cycle SWP(i+2) is used for the sweep cycle SWP(i+3) which is the next cycle. More specifically, in the sweep cycle SWP(i+3), the core 310 is supposedly in a state P2(i+3) (i.e. in the demagnetization state) at a time point after a lapse of a time corresponding to a half of the first saturation time ts1(i+2) from the time point Tf at which the magnetic saturation in the positive magnetization direction is detected. The value of the sensing current Is at this time point is specified as a first current value Is1(i+3).

Moreover, a time point at which the magnetic saturation in the positive magnetization direction is detected in the sweep cycle SWP(i+2) (i.e. a time point as a base point of the sweep cycle SWP(i+3)) is the time point Tf, and a time point at which the magnetic saturation in the negative magnetization direction is detected in the sweep cycle SWP(i+3) is the time point Tg. In other words, a first saturation time ts1(i+3) specified in the sweep cycle SWP(i+3) is a time length from the time point Tf to the time point Tg. The first saturation time ts1(i+3) specified in the sweep cycle SWP(i+3) is also used for the sweep cycle SWP(i+4) (not illustrated) which is the next cycle, in the same manner.

The invention may be embodied in other specific forms without departing from the spirit or essential characteristics thereof. The present example is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2012-082382 filed on Mar. 30, 2012 including the specification, claims, drawings and summary is incorporated herein by reference in its entirety.

<Industrial Applicability>

The present invention can be applied to current detection on a magnetic current sensor.

What is claimed is:

1. An electric current measurement method for measuring a target electric current on a magnetic current sensor, the magnetic current sensor comprising: a core in which a magnetic flux density changes depending on the target electric current; an electrically conductive device capable of changing the magnetic flux density of the core depending on a sensing current; and an adjusting device capable of controlling a direction of the sensing current, said electric current measurement method comprising:

a first controlling process of sweeping the sensing current toward in a negative magnetization direction in a condition that the core is saturated magnetically in a positive magnetization direction due to the target electric current;

a first detecting process of detecting the magnetic saturation of the core in the negative magnetization direction due to the first controlling process;

a second controlling process of sweeping the sensing current toward in the positive magnetization direction if the magnetic saturation of the core in the negative magnetization direction is detected due to the first detecting process;

a second detecting process of detecting the magnetic saturation of the core in the positive magnetization direction;

a first specifying process of specifying, as a first current value, a value of the sensing current if the core is demagnetized in said first controlling process on the basis of a first saturation time which is a time length from a time point at which the magnetic saturation of the core in the positive magnetization direction is detected in the second detecting process, to a time point at which the magnetic saturation of the core in the negative magnetization direction is detected in the first detecting process;

a second specifying process of specifying, as a second current value, a value of the sensing current if the core is demagnetized in said second controlling process on the basis of a second saturation time which is a time length from a time point at which the magnetic saturation of the core in the negative magnetization direction is detected in the first detecting process, to a time point at which the magnetic saturation of the core in the positive magnetization direction is detected in the second detecting process; and a calculating process of calculating a value of the target electric current on the basis of the specified first and second current values, said first controlling process and said second controlling process being performed repeatedly.

2. The electric current measurement method according to claim 1, wherein the electrically conductive device is an electrically conductive coil wound around the core.

3. The electric current measurement method according to claim 1, wherein
in said first controlling process, the magnetic saturation of the core in the negative magnetization direction is detected if the value of the sensing current is greater than or equal to a maximum value corresponding to the negative magnetization direction, and
in said second controlling process, the magnetic saturation of the core in the positive magnetization direction is detected if the value of the sensing current is greater than or equal to a maximum value corresponding to the positive magnetization direction.

4. The electric current measurement method according to claim 1, wherein
a value of the sensing current at a time point corresponding to a half of the first saturation time in the past is specified as the first current value in said first specifying process, and
a value of the sensing current at a time point corresponding to a half of the second saturation time in the past is specified as the second current value in said second specifying process.

5. The electric current measurement method according to claim 1, wherein the target electric current is an electric current which flows through an inverter for a vehicle.

* * * * *